(12) United States Patent
Huang et al.

(10) Patent No.: US 11,056,603 B2
(45) Date of Patent: Jul. 6, 2021

(54) PHOTODETECTORS WITH CONTROLLABLE RESONANT ENHANCEMENT

(71) Applicant: HEWLETT PACKARD ENTERPRISE DEVELOPMENT LP, Houston, TX (US)

(72) Inventors: Zhihong Huang, Palo Alto, CA (US); Xiaoge Zeng, Palo Alto, CA (US); Wayne Victor Sorin, Palo Alto, CA (US)

(*) Notice: Subject to any disclaimer, the term of this patent is extended or adjusted under 35 U.S.C. 154(b) by 0 days.

(21) Appl. No.: 16/569,617

(22) Filed: Sep. 12, 2019

(65) Prior Publication Data

US 2021/0013356 A1 Jan. 14, 2021

Related U.S. Application Data

(60) Provisional application No. 62/873,677, filed on Jul. 12, 2019.

(51) Int. Cl.
 *H01L 31/107* (2006.01)
 *G02B 6/42* (2006.01)
 (Continued)

(52) U.S. Cl.
 CPC .......... *H01L 31/107* (2013.01); *G02B 6/42* (2013.01); *H01L 31/02027* (2013.01); *H01L 31/02327* (2013.01)

(58) Field of Classification Search
 CPC .......... H01L 31/107; H01L 31/02027; H01L 31/02327; G02B 6/42
 See application file for complete search history.

(56) References Cited

U.S. PATENT DOCUMENTS

| 2002/0024058 A1* | 2/2002 | Marshall ............. H04N 5/3745 257/170 |
| 2015/0108327 A1* | 4/2015 | Huang ............ H01L 31/035281 250/200 |
| 2019/0074397 A1 | 3/2019 | Hassan et al. |

OTHER PUBLICATIONS

Su et al., "Whispering Gallery Germanium-on-Silicon Photodetector", Optics Letters, vol. 42, 6 pages.
(Continued)

*Primary Examiner* — Kyoung Lee
*Assistant Examiner* — Christina A Sylvia
(74) *Attorney, Agent, or Firm* — Sheppard Mullin Richter & Hampton LLP

(57) ABSTRACT

Resonant cavity photodetector structures which integrate photodetection and filtering capabilities is described. A resonant cavity photodetector structure generally can comprise a region including a resonator, and an absorption region that can be integrated into a cavity of the resonator. The resonator can perform filtering that is suitable for high-bandwidth optical communications, such as Dense Wavelength Multiplexing (DWDM). In some cases, the resonator is a microring resonator. An absorption region can include a photodiode which performs optical energy detection acting as a photodetector, such as an avalanche photodiode (APD) wherein the photodiode. A coupling distance between the resonator region and the absorption region can be controlled, which allows control of a coupling strength between an optical mode of the resonator and the absorption region such that a quality factor (Q-factor) can be tuned. Thus, by adjusting the Q-factor, the resonant cavity photodetector structure can be tuned to achieve a desirable performance.

10 Claims, 8 Drawing Sheets

(51) Int. Cl.
*H01L 31/02* (2006.01)
*H01L 31/0232* (2014.01)

(56) References Cited

OTHER PUBLICATIONS

Li, X. et al., 40 Gb/s All-silicon Photodetector Based on Microring Resonators, IEEE Photonics Technology Letters, Apr. 1, 2015, vol. 27 No. 7, 5 pgs., IEEE. 1.

Li, Y. et al., Sub-bandgap Linear-absorption-based Photodetectors in Avalanche Mode in PN-diode-integrated Silicon Microring Resonators, Dec. 2013, https://www.researchgate.net/publication/258955277_Sub-bandgap_linear-absorption-based_photodetectors_in_avalanche_mode_in_PN-diode-integrated_silicon_microring_resonators, website accessed May 21, 2019, 6 pgs.

Martinez, N., Waveguide-coupled Avalanche Photodiodes for a CMOS Compatible Tranceiver Package, Nanoscience and Microsystems ETDs Dissertation, Jul. 13, 2017, 187 pgs, UNM.

* cited by examiner

PHOTODETECTORS WITH CONTROLLABLE RESONANT ENHANCEMENT

RELATED APPLICATIONS

This application claims the benefit of U.S. Provisional Patent Application No. 62/873,677, filed on Jul. 12, 2019, the contents of which is incorporated herein by reference in its entirety.

DESCRIPTION OF RELATED ART

Dense Wavelength Division Multiplexing (DWDM) is an optical multiplexing technology that can be used to increase bandwidth over existing fiber networks. DWDM typically consists of combining and transmitting multiple signals simultaneously, at different wavelengths, on the same fiber, thus multiplying the capacity of the physical medium. DWDM interconnects using nanophotonics, in general, can offer orders of magnitude improved bandwidth and energy efficiency over electrical interconnects. Emerging multi-core computing systems, which often require an interconnect fabric that provides high throughput at low power with a small footprint, may lend themselves to employ DWDM technology. Furthermore, there are several advancements being made in the realm of photonics, such as photonic integrated circuits and integrated active devices. As progress in optical networking systems continues, there may be potential benefits in leveraging developments in photonics towards further improving optical communications, such as DWDM technology.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
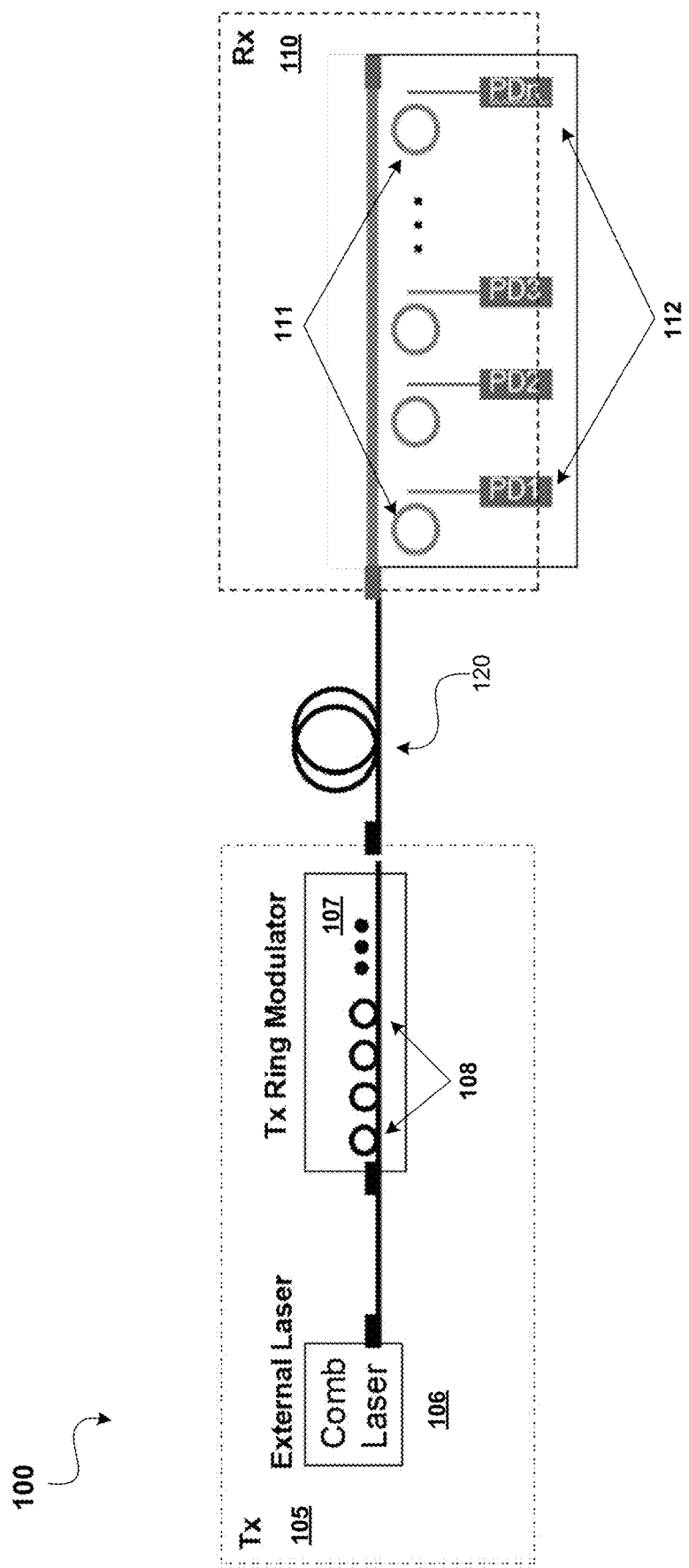
FIG. 1 is a conceptual diagram of a Dense Wavelength Division Multiplexing (DWDM) silicon photonics optical system, according to some embodiments.

The figures are not exhaustive and do not limit the present disclosure to the precise form disclosed.

DETAILED DESCRIPTION

Various embodiments described herein are directed to a resonator cavity photodetector structure (also referred to herein as a resonator photodetector device). The disclosed resonator cavity photodetector structure is uniquely designed to implement both filtering and photodetection, for example operating as a filter/photodetector in an receiver used in optical communication technologies, such as Wavelength Division Multiplexing (WDM) and Dense Wavelength Division Multiplexing (DWDM). Due to the resonator cavity device being an integration of active devices, its employment can provide enhancements over many existing DWDM receiver designs, for example. In contrast, some conventional DWDM receivers typically require an optical filter device, such as an optical ring resonator filter, and a separate photodetector device, such as a silicon (Si) photodiode. Over the past years, there have been some demonstrations of integrated active devices in the realm of optical communications. For instance, various developments including germanium-based photodetectors and III-V integrated sources and detectors have emerged. However, there are several challenges and design considerations involved with integrating active devices, which has stifled advancements towards creating a plethora of integrated active devices that may be useful in DWDM applications.

In particular, with respect to integrating filtering and photodetection onto a single photonic device, there are drawbacks related to the potentially negative impacts that an absorption region of a photodetector (e.g., an avalanche photodiode) may have on the resonance of a filter (e.g., microring resonator filter). For instance, silicon geranium (SiGe) avalanche photodiodes (APDs) often times have an improved sensitivity which can lead to reductions in the optical link budget, thereby making their use very desirable in DWDM receivers. However, APDs also particularly have a high absorption coefficient from its geranium absorption region. Due to this relatively high absorption coefficient, integrating a SiGe APD within a microring resonator filter, for example, can cause large loss in the ring resonance. However, in a DWDM system, there is generally a low tolerance for such large optical loss at the filter. In most cases, a resonant cavity filter in a DWDM system must have a high quality factor (Q-factor) in order to perform high-speed filtering of multiple-wavelengths having a tight channel spacing (e.g., 50 GHz-200 GHz). As referred to herein, the term "Q" or Q-factor is a measure of the sharpness of the resonance relative to its central frequency. A physical meaning of the Q-factor can relate to the number of round-trips made by the energy in the resonator before being lost to internal loss and the bus waveguides. Consequently, without accounting for the effects of introducing an absorption region proximal to a resonant cavity, this integration can lower the Q-factor of the resonant filter to the point where the device's use in DWDM systems becomes impractical. Nonetheless, the disclosed resonant cavity photodetector structure is uniquely designed to compensate for these challenges related to integration. The resonant cavity photodetector structure, as disclosed herein, can have a coupling distance between the resonator and the absorption region that is adjustably controlled. By varying this distance, or overlap, the Q-factor or resonant enhancement factor for the structure can also be controllably tuned. Furthermore, the Q-factor of the structure can be tuned (vis-à-vis tuning the coupling distance) in a manner that ensures optimal function of the resonant filter (e.g., having a particular Q-factor for a specific DWDM application) while realizing the advantages of active device integration, such as low cost and a reduced footprint.

Additionally, the resonant cavity photodetector structure can use a specific type of resonant filter, namely a microring resonator filter. Regarding microring resonator filters, it may be typically desirable in DWDM systems to structure the resonators as silicon rings with extremely small dimensions to support the high speed demands associated with optical communications. For instance, it is common for microring resonators used in DWDM systems to have a diameter that is approximately between 5 µm to 10 µm. However, fully fabricating an APD inside of a microring may cause the resulting ring structure to be too large. For example, covering an entire area of the microring resonator with Ge for forming the APD structure requires a significantly larger geometry for the silicon ring than typically used (and can additionally cause optical loss). A ring resonator with unduly large dimensions may result in an increased transit time, which ultimately causes the filter to have significantly slower responsivity. Thus, an optical receiver including large ring resonators, solely for the purposes of integrating APDs, would be counterintuitive to the fast filtering responses that are often required by DWDM systems. Furthermore, larger ring resonators also characteristically have increased capacitance (in comparison to smaller microrings resonators). Capacitance is a fundamental concept pertaining to the operation of ring resonators. The capacitance of a ring resonator, generally, impacts movement of the carriers within the ring, which in turn impacts the resonator's operation speed. As a consequence, ring resonators that are structured too largely can yield such a large capacitance that they run the risk of causing even greater lag in the filter's speed.

In reference to APDs, their use as photodetectors can realize higher speeds and higher sensitivity in comparison to other more conventional types of photodetectors (e.g., PIN photodetector). The long-haul, high-bit-rate nature of DWDM-based optical communications lends itself for use of APDs. However, a critical design consideration regarding APDs may be whether the APDs used can achieve a high enough bandwidth to support the high data rates that are typical of DWDM systems. The bandwidth realized by an APD is often a function of a width, or thickness, of its absorption region. It has been found that with thin absorption layers, APDs can have low carrier transit times and achieve very high bandwidths (e.g., >20 GHz). As an example, in order to implement a DWDM system having a 112 Gbps (PAM4) data rate, the APD may be required to have an operational bandwidth of approximately 40 GHz. To meet the abovementioned bandwidth criteria, the thickness of the absorption region (e.g., Ge layer in the case of a SiGe APD) may need to be reduced, for instance from 400 nm to 200 nm. Therefore, in general, a thinner absorption region can be considered more desirable for the APD to achieve higher bandwidth. On the other hand, reducing the thickness of the APD's absorption region too much can also lead to a reduction in its responsivity as a photodetector (even for waveguide APDs). Therefore, the disclosed resonant cavity photodetector structure can have additional design features that optimize the trade-offs related to the dimensions and practical functions of the microring resonator and the APDs.

Referring now to FIG. 1, a diagram of a DWDM system 100 is shown. The DWDM system 100 can include DWDM photonic interconnects based on silicon photonics. In general, FIG. 1 illustrates the system 100 as including an optical link 120 that is physically coupling an optical transmitter module (Tx) 105 for transmitting information modulated onto optical signals that are received by an optical receiver module (Rx) 110. The optical transmitter 105 further includes several key components for transmitting an optical signal: a multi-length light source, shown as comb laser 106; an optical modulator, shown as microring modulator 107 including several cascading silicon microrings 108. The optical receiver module 110 is shown to include several key components for receiving an optical signal: optical filters, shown as microring resonator filters 111; and photodetectors 112. As alluded to above, DWDM technology is widely used in fiber-optic telecommunications to increase the system capacity (e.g., without replacing existing backbone optic network). The optical transmitter module 105 in the DWDM system 100 uses a multi-wavelength light source. In the example of FIG. 1, the light source is an external (e.g., off-chip) comb laser 106. The optical transmitter module 105 can multiplex N independent data streams, serialize them, and modulate them onto N different wavelengths $\lambda_1 \ldots \lambda_N$ of light, typically having 50 GhZ-100 GHz of channel spacing. These data streams generated by the optical transmitter module 105 can then be sent together and propagated through an optical fiber 120, such as an optical cable, for a long distance (e.g., kilometers). Subsequently, at the optical receiver module 110 optical filters can be tuned for the N corresponding wavelengths. As seen in FIG. 1, the optical filters can be implemented as multiple microring resonators filters 111. A compact and scalable DWDM photonic link can be implemented by using cascading silicon microring resonators to implement the modulator 107 (at the Tx-end) and the filters 111 (at the Rx-end) with slightly different radii to a single waveguide. In addition, the optical receiver 110 includes a series of photodetectors 112, where each photodetector 112 is correspondingly connected to a respective optical filter. As previously described, SiGe APDs can be used as photodetectors 112. The microring resonator filters 111 and the photodetectors 112 can serve as the de-multiplexer and de-serializer to convert the multi-wavelength serialized optical signals back to N independent electrical data streams simultaneously. It should be appreciated that the DWDM system 100 shown in FIG. 1 can be either an interchip or an intrachip optical link.

In order to realize chip-scale DWDM nanophotonic interconnects for the system 100, the use of microring resonators offers multiple advantages, such as a small footprint (e.g., 10 µm in diameter) and low driving power. As shown in FIG. 1, microring resonators can be configured to implement both the optical modulator 107 at the Tx-side 105 and the optical filter 111 at the Rx-side 110. However, silicon microring resonators have a resonance wavelength $\lambda$ dependence. As previously discussed, a resonant cavity photodetector structure having both filtering and photodetection capabilities is described herein. Thus, for example, a single resonant cavity structure can be used to replace a microring resonant filter 111 and photodetector 112 pair in the system of FIG. 1. Consequently, by using resonant cavity photodetectors structures in the DWDM system 100, which effectively integrates the respective operations of two distinct photonic devices into one structure, the footprint of the optical receiver 110 may be substantially reduced.

Figure 2A:
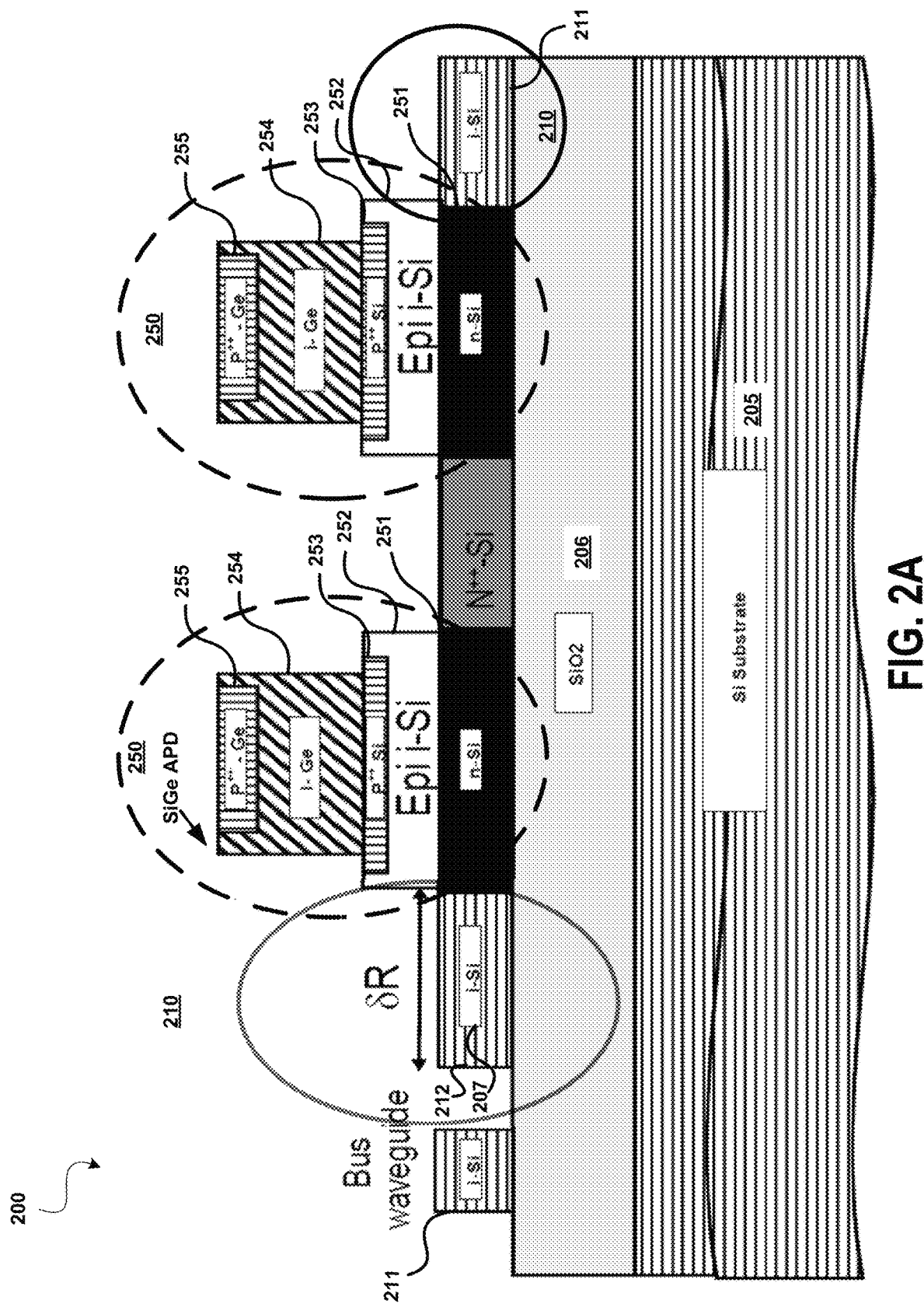
FIG. 2A illustrates a cross-sectional view of an example of a resonant cavity photodetector structure that can be utilized within a DWDM system, for example the DWDM system depicted in FIG. 1, including a controllable coupling distance between a resonator region of a microring resonator and an absorption region of an avalanche photodiode (APD), according to some embodiments.

In FIG. 2A, an example of a resonant cavity photodetector structure 200 is shown. FIG. 2 is a schematic of a cross-sectional view of the structure 200 that can be fabricated as an integrated circuit (IC), for example as a part of a Complementary Metal-Oxide-Semiconductor (CMOS) DWDM transceiver chip. As described above, a key feature of the resonant cavity photodetector structure 200 is its capability to operate as both a filter and a photodetector at an optical receiver, for instance within the DWDM system (shown in FIG. 1). Additionally, this resonant cavity photodetector structure 200 is uniquely designed to include a coupling distance δR that can be controllably adjusted to ultimately tune the resonant Q-factor of the structure 200.

In FIG. 2 the schematic illustrates multiple layers of materials that may be deposited on a substrate while fabricating the resonant cavity photodetector structure 200. Generally, the resonant cavity photodetector structure 200 can be described as a silicon microring resonator having materials for forming a SiGe APD integrated in the ring cavity. For purposes of discussion, the resonant cavity photodetector structure 200 will be described herein by first referring to the regions forming the microring resonator 210 (indicated in FIG. 2A by solid-lined circles), and then to the regions specifically forming the SiGe APDs 250 (indicated in FIG. 2A by dashed-lined circles). As used herein, the term "region" refers to a portion of the resonant cavity photodetector.

Figure 5:
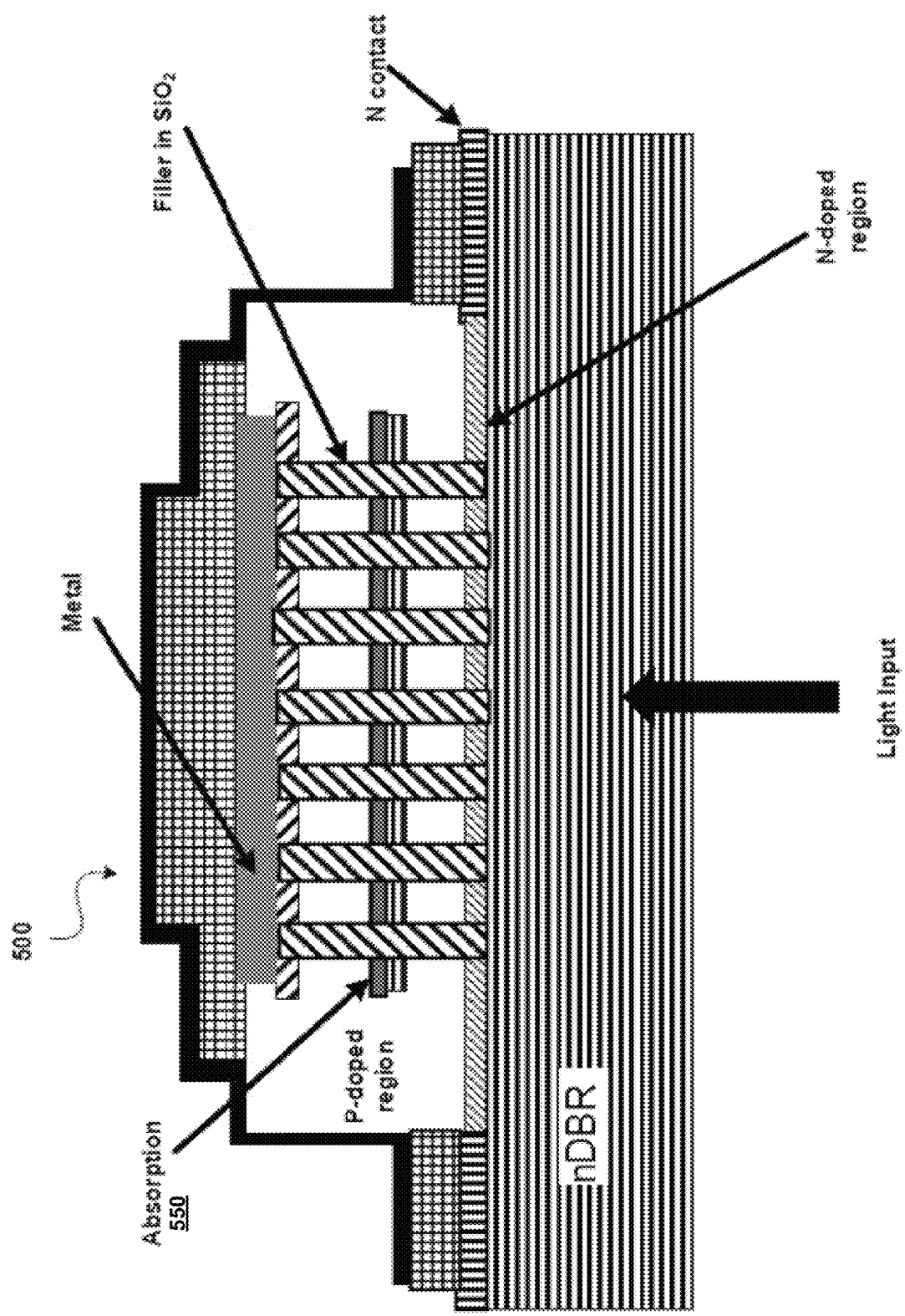
FIG. 5 illustrates a cross-sectional view of another example of a resonant cavity photodetector structure that can be utilized within a DWDM system, for example the DWDM system depicted in FIG. 1, including an absorption region that is positioned between a resonant cavity of a Fabry Perot resonator, according to some embodiments.

As discussed in reference to FIG. 1, resonant filters, such as microring resonator filters may be used in energy-efficient optical receivers (or transceivers) for DWDM optical interconnects. In FIG. 2A, the resonant cavity photodetector structure 200 includes a microring resonator 210 to implement its filtering capabilities. However, the high integration density and low power consumption necessary for photonic networks requires optical devices with extremely small, or micro, dimensions. As a result, microrings, for instance microring resonator 210, are often suitable in DWDM applications due to small sizes, and high Q-factors when acting as optical filters. Furthermore, resonant cavity structures can be made into electro-optical detectors when carrier injection, optical gain or optical absorption mechanisms are incorporated therein. The embodiments leverage this characteristic, integrating an absorption region into the cavity of the microring resonator 210 allowing the resonant cavity photodetector structure 200 to perform high-speed filtering and photodetection. It should be understood that the structure 200 is not limited to microring resonators shown in FIG. 2A, and other forms of resonant cavity structures capable of performing filtering can be used as deemed appropriate, such as ring resonators, photonic crystals, and the like. For example, FIG. 5 illustrates another example of a resonant cavity photodetector structure including a Fabry Perot cavity as the resonator (instead of a microring resonator).

The microring resonator 210 having a small size is critical for several reasons. First, a smaller size allows for more microrings to fit into a given area, therefore providing higher integration density. Second and more importantly, the power consumption of the modulator, which is a key performance factor for the electro-optical modulators, is directly proportional to the circumference and inversely proportional to the optical Q-factor of the microring resonator. Reducing the size of the ring without sacrificing the Q is critical for low-power operation. Thirdly, the total bandwidth of the microring-based DWDM modulation system is limited by the freespectral range (FSR) of the microring resonator, which is inversely proportional to the circumference of the ring. A smaller microring modulator has a larger FSR, which can fit in more wavelength channels and have higher aggregated data bandwidth.

Figure 2B:
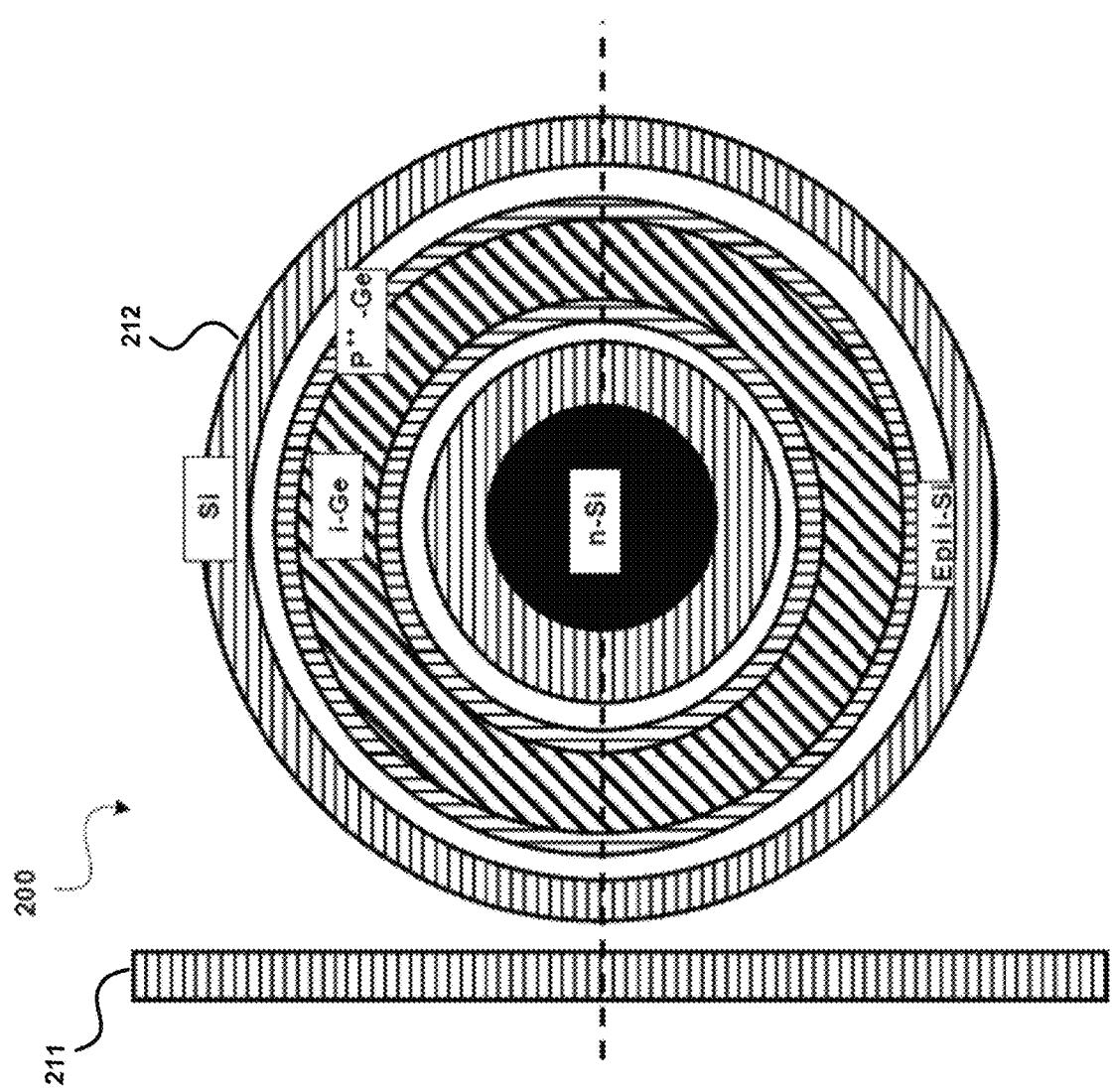
FIG. 2B illustrates a top view of the example of the resonant cavity photodetector structure depicted in FIG. 2A, according to some embodiments.

Particularly, the microring resonator 210 is a silicon microring resonator containing a ring waveguide 212 coupled to a bus waveguide 211. The bus waveguide 211 is a silicon (Si) waveguide having a primarily linear (e.g., straight) geometric shape. The ring waveguide 212, can be another silicon waveguide, but having a circular or primarily annular structure. The bus wave guide 211 can serve as an input waveguide that inputs the optical signal into the ring waveguide 212 (e.g., via evanescent coupling). FIG. 2B is a top view of the resonant cavity photodetector structure 200 that more prominently shows the shapes of the ring resonator's 210 waveguides, illustrating the bus waveguide 211 as a line or silicon bar. As seen in FIG. 2B, the ring waveguide 212 has a more circular shape, like a disk. The ring waveguide 212 may be formed by a tightly bent silicon-on-insulator (SOI) strip waveguide. The optical mode in a bent dielectric waveguide, as in the case of microring resonator 210, is a leaky mode, with a bending loss that increases as the bending radius of the ring waveguide 212 decreases. Therefore, at a given resonant wavelength, when the microring resonator 210 has a smaller radius it will also typically have a lower intrinsic Q. At higher Q, light is trapped in the ring for a longer time, and this will eventually limit the speed of the microring resonator 210. In order to achieve fast response, the microring resonator 210 may be set to have a Q of 2000-25000, which is often a metric are typically used. In some cases, the ring waveguide 211 can have a diameter in the tens of micrometers. The microring resonator 210 can have two output ports (i.e., a through port and a drop port). When an integer multiple of the incident light wavelength ($m\lambda_i$) fits exactly around a perimeter ($m\lambda_i$=p) a resonance condition is achieved.

Now, the materials forming the microring resonator 210 shown in FIG. 2A will be described in detail below. In the illustrated example, the resonant cavity photodetector structure 200 has a silicon (Si) substrate 205. Thus, the waveguides 211, 212 of the microring resonator 210 may be formed on a silicon substrate. Also, the substrate may be formed from materials other than silicon, for example an insulator wafer, a silicon dioxide wafer, a region of silicon dioxide formed on a silicon wafer (e.g., grown on the silicon wafer), or the like. In one example, the substrate may be the silicon dioxide buried oxide. A silicon dioxide ($SiO_2$) layer 206 may be used as waveguide cladding. The waveguides 211, 212 can be formed from a layer of silicon 207 which serves as the core for the waveguides. A microring resonator 210 can use free carrier plasma dispersion effect to change the silicon refractive index, which changes the phase of the light passing through it. By changing the free-carrier density, the resonance wavelength of a microring resonator 210 can be altered. This can be achieved by either injecting or removing carriers, which leads to two common types of microring resonators: a carrier-depletion modulator based on reverse-biased PN-diode; and a carrier injection modulator based on forward-biased PIN-diode.

As alluded to above, photodiodes, such as APDs, can detect optical energy and thus are often employed as photodetectors in optical transceivers (shown in FIG. 1). Photodiodes may convert optical signals into electrical signals by absorbing optical energy (e.g., photons) and moving electrons to a conduction band in response to absorbing the optical energy. The electrons in the conduction band are free electrons able to travel through the photodiode in response to an electric field. The photodiode may internally amplify the electrical signal by accelerating the electrons until they free additional electrons through impact ionization. The amplified electrical signal may be output by the photodiode. The photodiode may include different materials to perform the different functions of the photodiode. For example, germanium is good at absorbing optical energy at the wavelengths typically used for optical communication.

In the case of SiGe APDs 250 used in the example structure 200 in FIG. 2A, the photodiodes include an absorption region made of germanium (Ge) to absorb optical energy and generate free electrons from the absorbed optical energy. The photodiode may include a charge region made of silicon. The charge region may include an increasing electric field as the distance from the absorption region increases. The photodiode may also include a multiplication region made of silicon to generate additional free electrons from impact ionization. The increasing electric field in the charge region may allow there to be a large electric field in the multiplication region and small electric field in the absorption region. The absorption region may include germanium to take advantage of the absorption characteristics of germanium, and the multiplication region may include silicon to take advantage of the impact ionization characteristics of silicon. Other examples may include materials other than germanium and silicon in the absorption, charge, and multiplication regions, and the materials for each region may be selected based on which material characteristics are most advantageous for each region.

As seen in FIG. 2A, the resonant cavity photodetector structure 200 may include SiGe APDs 250. For instance, the SiGe APDs 250 can be a SiGe ring or an APD disk, which coincides with the geometry of the microring resonator 210. However, it should be appreciated that the structure 200 is not limited to SiGe APDs 250 and other forms of photodiodes capable of performing photodetection can be integrated into the ring cavity of the microring resonator 210 as deemed appropriate. As a general description, the various layers of materials forming the SiGe APDs 250 can be brought into close proximity to the ring silicon waveguide 255 of the microring resonator 210, which enabling evanescent coupling. Furthermore, by embedding the SiGe APDs 250 into the cavity of the ring resonator, the SiGe APDs 250 will respond to the ring resonant frequencies and allow the structure 200 to operate as a photodetector. However, the transition between the silicon of the ring waveguide 255 and the absorption region (e.g., Ge) of the SiGe APDs 250 can introduce loss, thereby reducing the Q-factor of the microring resonator 210. However, the loss introduced by the detector should be sufficiently small not to quench the ring resonance too much. This eliminates the additional source of loss in the ring, and also enables a much stronger overlap of the optical mode with the gain medium. The resonance enhancement of the structure 200 provides an internal gain that further increases its responsivity.

Now, the materials forming the SiGe APDs 250 shown in FIG. 2A will be described in detail below. The SiGe APDs 250 may including several layered materials, including but not limited to: a doped germanium layer (P++ Ge) 255; an intrinsic geranium layer (i-Ge) 254; a "moderately doped" p-type silicon layer (P++ Si) 253; an intrinsic silicon layer (Epi i-Si) 252; and a "highly-doped" n-type silicon layer (N—Si) 251. In this example resonant cavity photodetector structure 200, a n-type silicon layer 251 may be formed on the $SiO_2$ layer 206. The n-type silicon layer 251 may be highly doped (e.g., with a doping concentration of at least about $1 \times 10^{20}$ atoms/$cm^3$) and have a thickness between about 200 nm and about 2 μm.

An intrinsic silicon layer 252 can be on the n-type silicon layer 251. The intrinsic silicon layer 252 may have a p-type doping concentration no greater than about $2 \times 10^{16}$ atoms/$cm^3$ and a thickness between about 50 nm and about 1000 nm. Additionally, a moderately doped p-type silicon layer 253 can be formed on the intrinsic silicon layer. The moderately doped p-type silicon layer 253 may be formed by depositing silicon and implanting p-type dopants in the deposited silicon, by implanting p-type dopants in the top portion of intrinsic silicon layer 251, or the like. The moderately doped p-type silicon layer 253 may have a p-type doping concentration between about $2 \times 10^{17}$ atoms/$cm^3$ and about $2 \times 10^{18}$ atoms/$cm^3$ and a thickness between about 20 nm and about 100 nm. In some cases, a lightly doped p-type layer (not shown) may also be included, being formed on top of the moderately doped p-type silicon layer 253. As used herein, the term "lightly doped" refers to a semiconductor with a concentration of doped atoms no greater than about $2 \times 10^{17}$ atoms/$cm^3$.

As mentioned above, the absorption region of the photodiode may be made of intrinsic germanium. Thus, the SiGe APDs 250 can include an intrinsic geranium layer 254 formed on top of the moderately doped p-type silicon layer 253. The intrinsic geranium layer 254 may be formed by depositing germanium on the moderately doped p-type silicon layer 253.

Additionally, the SiGe APDs 250 may include a p-type germanium layer 255 that is formed in direct contact with the intrinsic geranium layer 254. The p-type germanium layer 255 may have a sloped electric field that prevents a strong electric field from causing impact ionization throughout the p-type doped germanium layer. In some cases, layers below the p-type germanium layer 255 can act to impede a strong electric field from extending into the p-type germanium layer 255, thereby further preventing impact ionization from occurring in the p-type doped germanium layer 255. The p-type germanium layer 255 may have a p-type doping concentration of at least about $5 \times 10^{18}$ atoms/$cm^3$ and a thickness between about 50 nm and about 2 μm. In the p-type germanium layer 255 may be the also referred to as a "doped" absorption region.

In general, low internal cavity loss is a requirement to achieve a high Q-factor. However, high loss may be experienced in a resonator cavity in cases when an optical mode couples too strongly to an absorption region (e.g., due to a absorption coefficient). In order to address this concern, a feature of the disclosed resonant cavity photodetector structure 200 allows for an adjusted control of this coupling between the optical mode and the absorption region. As illustrated in FIG. 2A, a coupling distance δR can be considered, in the structural sense, as a physical distance separating the microring resonator 210 and the SiGe APD 250. As a general description, a larger δR corresponds to a larger separation, causing the microring resonator 210 to be farther from the SiGe APD 250. Positioning the microring resonator 210 and the SiGe APD 250 farther apart has the advantage of weakening the coupling between the optical mode and the absorption region, thereby reducing loss in the ring cavity. In an ideal case, the δR can be set to a distance that ensures the optical mode stays in a Si pedestal region, with only a very small portion evanescently coupled to the Ge absorption region. Consequently, it can be considered that increasing the δR typically yields an increase in the Q-factor for the structure 200. Alternatively, reducing the δR may decrease the Q-factor. As a practical example, in order to tune the structure 200 for interoperability within DWDM receivers (e.g., supporting 50 GHz-200 GHz channel spacing) the δR can be set to about 1 μm or less. Nonetheless, there may be some scenarios where a high Q-factor is not a driving design concern, and it may be more desirable to reduce the device footprint as much as possible. In this case, the trade-off between a lower Q-factor and decreasing the δR such that the overall size of the structure 200 is minimized may be beneficial. In FIG. 2A, this coupling distance δR is the distance from an edge of the ring waveguide 212 to its boundary contacting the n-type silicon layer (n-Si) of the SiGe APD 250.

Figure 3A:
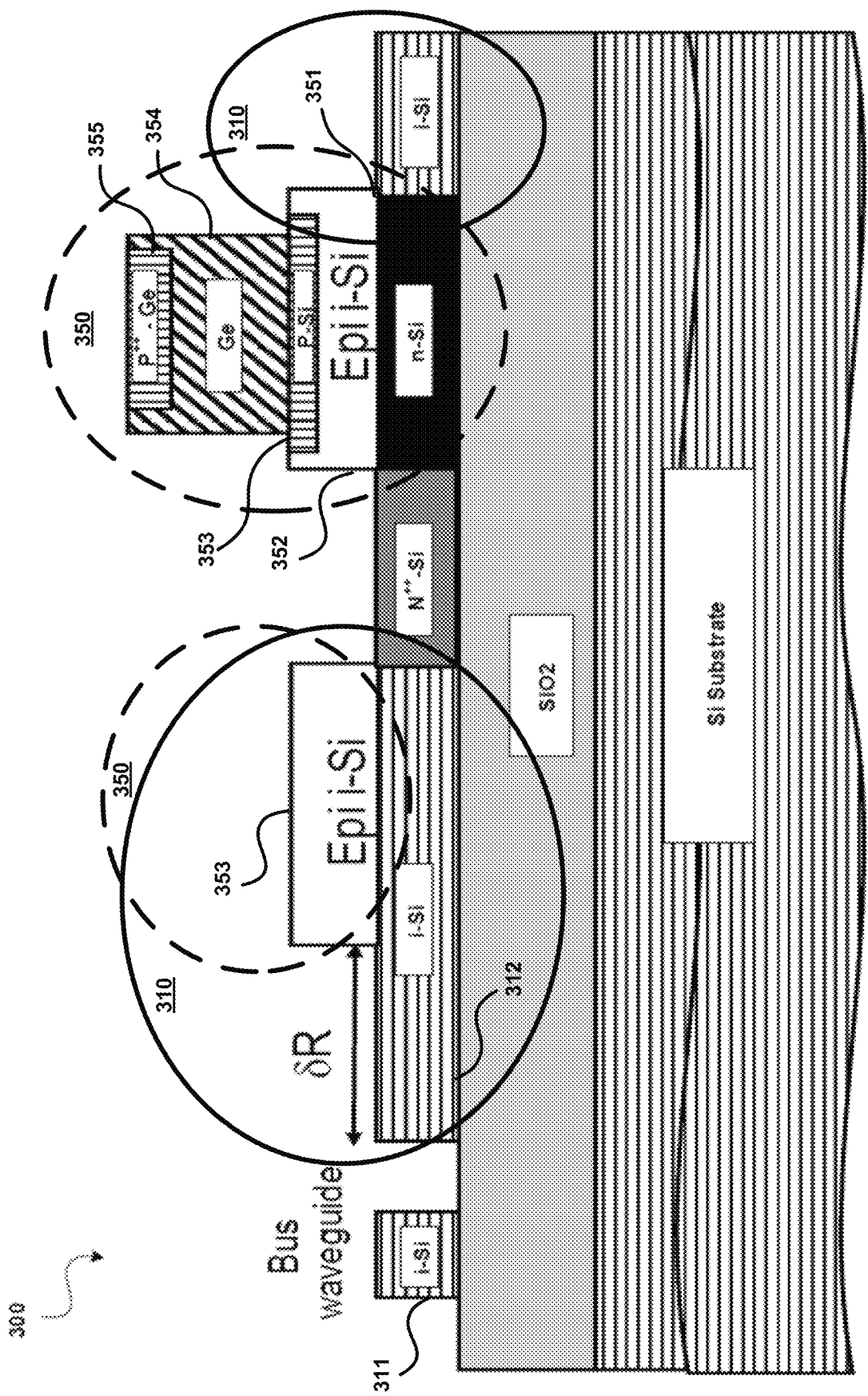
FIG. 3A illustrates a cross-sectional view of another example of a resonant cavity photodetector structure that can be utilized within a DWDM system, for example the DWDM system depicted in FIG. 1, including an APD formed on a section of a microring resonator, according to some embodiments.

Now referring to FIG. 3A, another example of a resonant cavity photodetector structure 300 is shown. Generally, many of the layers of material used to form both the SiGe APD 350 and microring resonator 310 regions of the structure 300 in FIG. 3A have substantially the same arrangement and function as previously described in reference to the example structure illustrated in FIG. 2A. Thus, for purposes of brevity, those materials are not described again here regarding FIG. 3A. Nonetheless, there are some distinctions with respect to the resonant cavity photodetector 300 shown in FIG. 3A.

In FIG. 3A, the SiGe APD 350 is particularly formed as a separate-absorption-charge-and-multiplication (SACM) APD. This separation associated with the formation of the SiGe APD 350 can be seen in FIG. 3A. In particular, an intrinsic silicon layer 353 is separately located from the other layered materials forming the remainder of the SiGe APD 350, namely the layers including the photodiode's absorption region (i.e., Ge layer 354). As background, the requirements for high-performance APDs can include high quantum efficiency, high speed, low dark current, a high gain-bandwidth product, and low multiplication noise. SACM APDs have been shown to achieve all of these properties. SACM APDs can utilize a thin charge layer for improved control of the electric field profile. For example, some SACM APD devices have shown RC-limited bandwidths above 30 GHz at low gains and gain-bandwidth products as high as 290 GHz. In some instances, SACM APDs include a thin uniformly doped charge layer inserted between the intrinsic multiplication region and the absorption region, allowing a high electric field inside the multiplication region to become relatively uniform. Regarding the illustrated example, the absorption region of the structure 300 is relatively thin. That is, the Ge layer 354 of the formed SiGe APD 350 may have a thickness between 100 nm-200 nm. By having the resonant enhancement, the unity gain photo response can be enhanced with the thin absorption region, namely the Ge layer 354 in the example of FIG. 3A. As alluded to above, a thin absorption region can result in a reduced carrier transit time, thereby enabling the resonant cavity photodetector structure 300 to achieve higher speeds. Also, the dark current will still maintain low, due to the small device area of the SiGe APD 350. In a broader sense, the resonance enhancement associated with integrating a photodiode, such as an APD, in the cavity of a resonator can alleviate the thickness requirements of conventional APDs, while still being able to achieve high unity gain responsivity. Thus, the resonant cavity photodetector structures disclosed herein generally have thinner (or smaller) APDs integrated, also allowing for a reduced carrier transit time and improved speed of the devices.

Figure 3B:
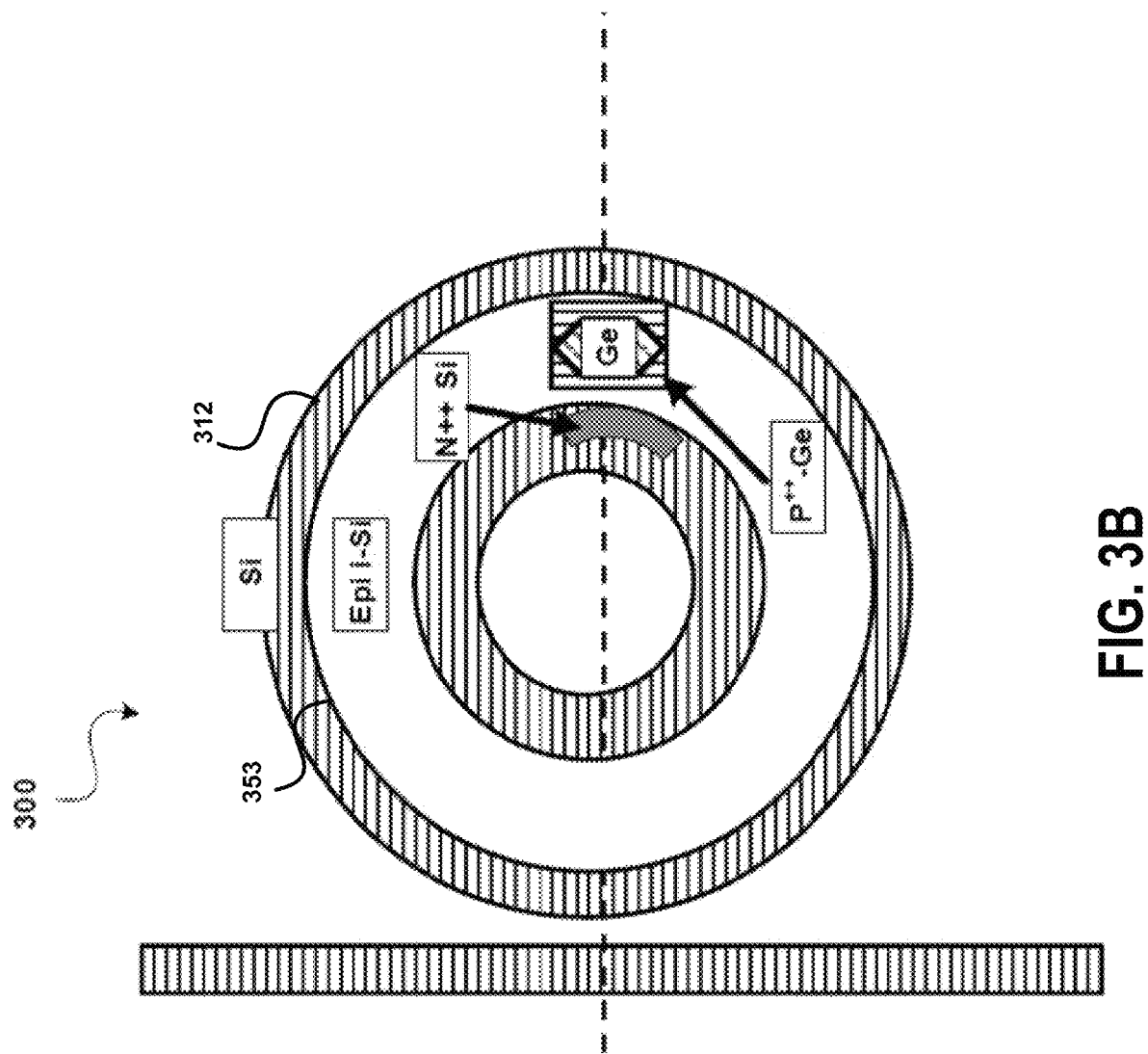
FIG. 3B illustrates a top view of the example of a resonant cavity photodetector structure depicted in FIG. 3A, according to some embodiments.

Also, a portion of the SiGe APD 350 is positioned on top of a portion of the silicon waveguide of the microring resonator 310. As seen in FIG. 3A, a layer of intrinsic silicon (Epi i-Si) 353 associated with the SiGe APD 350 is formed directly on top of a small section of the silicon ring waveguide 312 of the microring resonator 310. FIG. 3B, showing a top view of the structure 300, prominently illustrates this arrangement. As seen in FIG. 3B, the intrinsic silicon layer (Epi i-Si) 353 appears on top of the ring waveguide 312 similarly having a ring, or substantially annular shape. In comparison to the example structure in FIG. 2A which forms its SiGe APD completely within the cavity of the microring resonator (e.g., without being layered directly over the waveguides), the particular arrangement for structure 300 allows the area of its respective SiGe APD 350 to be substantially smaller. APDs having a smaller physical size can often achieve a reduced RC-limited bandwidth. Also, placing a portion of the APD device region on a section of the microring resonator 310 allows for the SiGe APD 350 to have a reduced capacitance (which is a characteristic of smaller sized photodiodes). The lower capacitance further enhances the speed of the SiGe APD 350 and, in turn, the overall operational speed of structure 300. Moreover, with respect to FIG. 3A, the coupling distance δR is illustrated as a distance between an edge of the ring waveguide 312 and the most proximally location portion of the SiGe APD 350 device, which is the separated intrinsic silicon (Epi i-Si) layer 353 in this example structure 300 using an SACM APD.

Figure 4A:
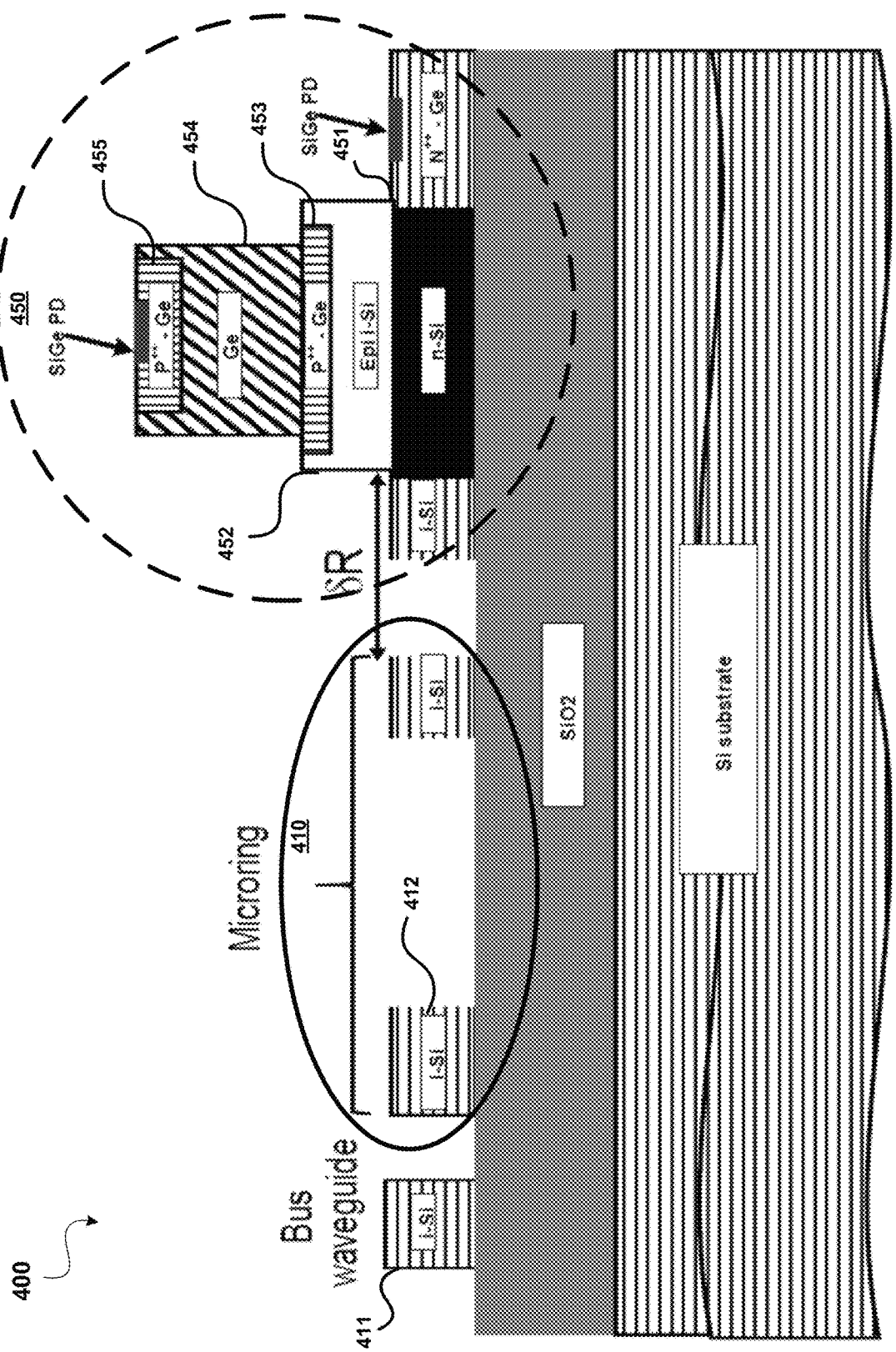
FIG. 4A illustrates a cross-sectional view of another example of a resonant cavity photodetector structure that can be utilized within a DWDM system, for example the DWDM system depicted in FIG. 1, including an absorption region that is positioned outside of an area of a microring resonator, according to some embodiments.
Figure 4B:
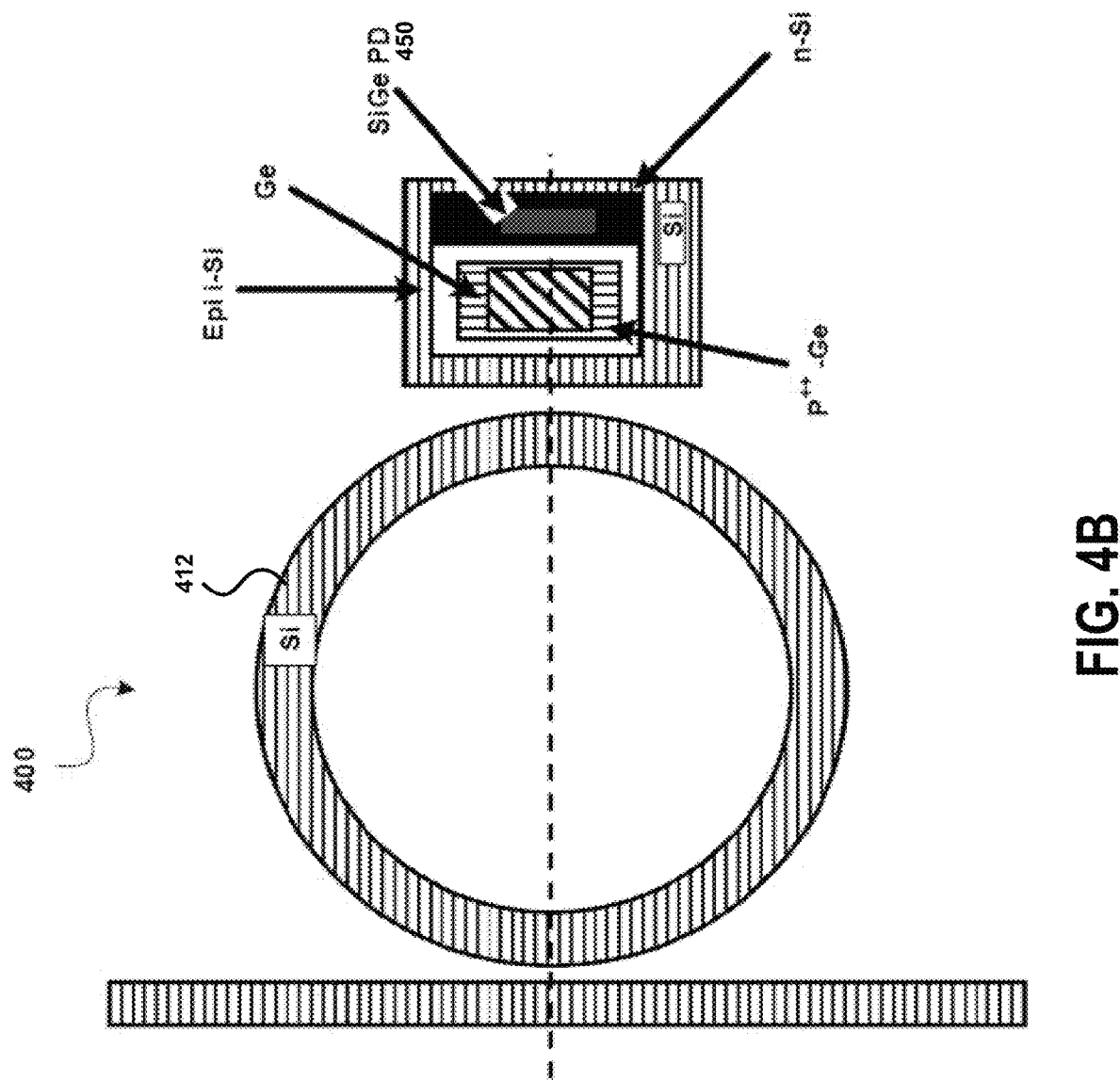
FIG. 4B illustrates a top view of the example of a resonant cavity photodetector structure depicted in FIG. 4A, according to some embodiments.

Yet another example of a resonant cavity photodetector structure 400 is illustrated in FIG. 4A. In general, many of the layers of material used to form both the SiGe APD 450 and microring resonator 410 regions of the structure 400 in FIG. 4A have substantially the same arrangement and function as previously described in reference to the example structure illustrated in FIG. 2A. Thus, for purposes of brevity, those materials are not described again here regarding FIG. 4A. Nonetheless, there are some distinctions with respect to the resonant cavity photodetector 400 shown in FIG. 4A. In particular, the region of the structure where the SiGe APD 450 is formed is completely outside of the microring resonator 410 (separation also represented in FIG. 4B by no overlap/intersection of the dashed-line circle and solid-lined circle). In other words, the structure 400 is arranged such that no portion of the absorption region, namely the SiGe APD 450, is placed on top of or inside of the ring waveguide 410 for the resonator (or filter) region. By having the absorption region outside of the microring resonator 410, the resonant cavity photodetector structure 400 has an arrangement that contrasts the previous structures in FIG. 2A and FIG. 3B. Accordingly, this particular arrangement may lend itself to structure 400 having an increased coupling distance δR between the optical mode of the resonator and the absorption region. The coupling distance δR is illustrated in FIG. 4A as the distance from an edge of the ring waveguide 412 of the microring resonator 410 and the intrinsic silicon layer 453 of the SiGe APD 450. Consequently, the design in FIG. 4A, which essentially separates the regions of the structure 400 corresponding to the SiGe APD 450 and the microring resonator 410, can generally yield higher Q-factors and reduced loss (in comparison to the structures in FIG. 2A and FIG. 3A). This separation between the absorption and resonator/filter regions is more prominently illustrated in the top view of the structure 400 FIG. 4B. For instance, there is no part of the SiGe APD that is placed in the area inside that of the ring (e.g., within the boundary defined by a diameter of the ring waveguide 412) or even directly contacting the perimeter of the ring waveguide 412.

Referring now to FIG. 5, another example of a resonant cavity photodetector structure 500 is illustrated. As alluded to above, the concept of integrating photodiodes into a cavity of a resonator is not limited to ring resonators, and can be extended to other types of known resonant cavity structures, such as Fabry Perot cavities. Accordingly, FIG. 5 shows an example of a resonant cavity photodetector structure 500, which integrates an absorption region 550 in a Fabry Perot resonant cavity. In this structure 500, the active area can be separated into smaller segments, which reduces the total device area depending on the fill factor. As mentioned above, a smaller active device area can reduce the total capacitance of the resonator, and thereby increase the speed of the device. Furthermore, segmenting the device area can effectively increase the mesa size, which enables better coupling with optical fibers. Regarding the Fabry Perot-based structure 500, in the case where the separated width is comparable to the absorption wavelength, light transmitting through the gap region can also be absorbed through evanescence coupling and scatter.

Accordingly, the embodiments disclosed herein can realize resonant cavity photodetector structures providing the solution of integrating photodetection and filtering photonic devices as a single structure. The disclosed structure can be designed to provide controllable tuning of the Q-factor of the resonator, without being dependent solely on the absorption coefficient of the photodiode. Even further, the resonant enhancements associated with the structure can enhance the responsivity of the photodiode (e.g., APD) by requiring a very thin absorption region, thereby realizing high operational speeds for resonant cavity photodetector device in a manner that is suitable for use with high-bandwidth, low-latency, and energy-efficient optical communications, such as DWDM systems.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A resonant cavity photodetector structure device having photodetection and filtering capabilities, comprising:
  a resonator region comprising a resonator photonic element, wherein the resonator photonic element performs resonance wavelength-based filtering to provide the filtering capabilities of the resonator photodetector device, wherein the resonator photonic element comprises a resonant cavity, and wherein the resonator photonic element is a microring resonator comprising a ring waveguide evanescently coupled to a bus waveguide;
  an absorption region adjacent to the resonator region and comprising photodiode photonic elements, wherein the photodiode photonic elements perform optical energy detection to provide the photodetection capabilities, wherein the photodiode photonic elements comprise an avalanche photodiode (APD), wherein the absorption region comprising the APD is positioned within the cavity of the resonator photonic element within an area bordered by a diameter of the ring waveguide; and a coupling distance between the resonator region and the absorption region, wherein the coupling distance is selectively adjusted to control a coupling strength between an optical mode associated with the resonator region and the absorption region and correspondingly control a quality factor (Q-factor) of the filtering capabilities.

2. The device of claim 1, wherein the absorption region comprising the APD is positioned within the cavity of the resonator photonic element.

3. The device of claim 1, wherein the coupling distance being selectively adjusted to increase a physical separation between an edge of the ring waveguide and the absorption region corresponds to lowering the coupling strength between an optical mode and the absorption region.

4. The device of claim 1, wherein the coupling distance is selectively adjusted to control the Q-factor such that a channel spacing between 50 GHz and 200 GHz is supported in a dense wavelength division multiplexing (DWDM) system.

5. The device of claim 1, wherein the APD comprises a silicon geranium (SiGe) APD.

6. A resonant cavity photodetector structure device having photodetection and filtering capabilities, comprising:

a resonator region comprising a resonator photonic element wherein the resonator photonic element performs resonance wavelength-based filtering to provide the filtering capabilities of the resonator photodetector device;

an absorption region adjacent to the resonator region and comprising photodiode photonic elements, wherein the photodiode photonic elements perform optical enemy detection to provide the photodetection capabilities, wherein the photodiode photonic elements comprise an avalanche photodiode (APD), wherein the APD is a separate-absorption-charge-and-multiplication (SACM) APD and a separate section of the SACM APD is positioned on a section of a ring waveguide; and a coupling distance between the resonator region and the absorption region, wherein the coupling distance is selectively adjusted to control a coupling strength between an optical mode associated with the resonator region and the absorption region and correspondingly control a quality factor (Q-factor) of the filtering capabilities.

7. The device of claim 6, wherein a physical size and an absorption layer thickness of the SACM APD are reduced such that a responsivity and a response speed of the device are increased.

8. A resonator photodetector device having photodetection and filtering capabilities, comprising:

a resonator providing the filtering capabilities of the resonator photodetector device, wherein the resonator is a microring resonator comprising a ring waveguide evanescently coupled to a bus waveguide; and a photodetector positioned on a portion of the resonator and providing the photodetection capabilities of the photonic resonator device, wherein a photodetector size associated with the photodetector is selectively adjusted to be smaller than a resonator size associated with the resonator and reduce the overall size of the resonator photodetector device and correspondingly control a carrier transit time associated with a speed of the resonator photodetector device, and wherein the photodetector comprises an intrinsic silicon layer that is positioned on top of a portion of the ring waveguide.

9. The device of claim 8, wherein the photodetector size is selectively adjusted to provide a capacitance that further controls the speed of the resonator photodetector device.

10. A resonant cavity photodetector structure device having photodetection and filtering capabilities, comprising:

a resonator region comprising a resonator photonic element, wherein the resonator photonic elements perform resonance wavelength-based filtering to provide the filtering capabilities of the resonator photodetector device, wherein the resonator photonic element comprises a microring resonator further comprising a ring waveguide evanescently coupled to a bus waveguide;

an absorption region adjacent to the resonator region and comprising an avalanche photodiode (APD) performing the photodetection capabilities, wherein the absorption region comprising the APD is positioned outside of an area bordered by a diameter of the ring waveguide; and a coupling distance between the resonator region and the absorption region, wherein the coupling distance is selectively adjusted to control a coupling strength between an optical mode associated with the resonator region and the absorption region and correspondingly control a quality factor (Q-factor) of the filtering capabilities.

* * * * *